(12) United States Patent
Sato et al.

(10) Patent No.: US 8,723,167 B2
(45) Date of Patent: May 13, 2014

(54) REFLECTING MATERIAL AND LIGHT EMITTING DIODE DEVICE

(75) Inventors: Satoshi Sato, Osaka (JP); Hisataka Ito, Osaka (JP); Yasunari Ooyabu, Osaka (JP); Yuki Shinbori, Osaka (JP)

(73) Assignee: Nitto Denko Corporation, Osaka (JP)

(*) Notice: Subject to any disclaimer, the term of this patent is extended or adjusted under 35 U.S.C. 154(b) by 168 days.

(21) Appl. No.: 13/484,399

(22) Filed: May 31, 2012

(65) Prior Publication Data

US 2012/0305969 A1 Dec. 6, 2012

(30) Foreign Application Priority Data

Jun. 1, 2011 (JP) ................................. 2011-123217

(51) Int. Cl.
*H01L 35/24* (2006.01)

(52) U.S. Cl.
USPC .................... 257/40; 257/98; 257/E51.001

(58) Field of Classification Search
USPC ...................... 257/40, 98, E51.001
See application file for complete search history.

(56) References Cited

U.S. PATENT DOCUMENTS

| 6,235,862 | B1 | 5/2001 | Isshiki et al. |
| 2002/0115762 | A1 | 8/2002 | Chung et al. |
| 2002/0187570 | A1 | 12/2002 | Fukasawa et al. |
| 2009/0091045 | A1 | 4/2009 | Tanikawa et al. |
| 2011/0049545 | A1 | 3/2011 | Basin et al. |
| 2011/0057228 | A1 | 3/2011 | Taniguchi et al. |

FOREIGN PATENT DOCUMENTS

| EP | 2 226 360 A1 | 9/2010 |
| JP | 2008-202036 | 9/2008 |
| JP | 2011-060819 A | 3/2011 |
| WO | 2007/125956 A1 | 11/2007 |

OTHER PUBLICATIONS

European Search Report issued in corresponding EP Application No. 12170179.1, dated Oct. 14, 2013.
XP-002713704, Thomson Scientific, London, GB, AN 2008-B39175.

*Primary Examiner* — Anthony Ho
(74) *Attorney, Agent, or Firm* — Sughrue Mion, PLLC (57) ABSTRACT

A reflecting material contains a silicone resin composition prepared from a polysiloxane containing silanol groups at both ends, an ethylenic silicon compound, a silicon compound containing an epoxy group, an organohydrogenpolysiloxane, a condensation catalyst, and an addition catalyst; and a light reflecting component.

9 Claims, 6 Drawing Sheets

REFLECTING MATERIAL AND LIGHT EMITTING DIODE DEVICE

CROSS-REFERENCE TO RELATED APPLICATION

The present application claims priority from Japanese Patent Application No. 2011-123217 filed on Jun. 1, 2011, the contents of which are hereby incorporated by reference into this application.

BACKGROUND OF THE INVENTION

1. Field of the Invention

The present invention relates to a reflecting material and a light emitting diode device, to be specific, to a light emitting diode device and a reflecting material for forming a reflector used in the light emitting diode device.

2. Description of Related Art

In recent years, as a light emitting device that is capable of emitting high-energy light, a light emitting diode device has been known. The light emitting diode device is provided with, for example, a diode board, an LED (light emitting diode element) mounted thereon, and a reflector disposed on the diode board at the side of the LED. The light emitting diode device emits higher energy light by light emitted from the LED upward and reflecting light produced by reflecting the light emitted from the LED laterally by the reflector.

As such a reflecting material for forming the reflector, for example, a resin composition for optical semiconductor element housing package containing an epoxy resin, an acid anhydride curing agent, and a white pigment has been proposed (ref: for example, Japanese Unexamined Patent Publication No. 2011-060819).

In Japanese Unexamined Patent Publication No. 2011-060819, by a transfer molding from the resin composition for optical semiconductor element housing package, an insulating resin layer (reflector) is formed on the diode board so as to house an optical semiconductor element (LED).

SUMMARY OF THE INVENTION

The insulating resin layer (reflector) of the light emitting diode device is required to have both heat resistance in which light reflectivity thereof is not easily reduced even when heat emitted from the LED transmits therethrough and light resistance in which the light reflectivity thereof is not easily reduced even when exposed to light emitted from the LED.

However, in the light emitting diode device in Japanese Unexamined Patent Publication No. 2011-060819, the heat resistance and the light resistance of the insulating resin layer are not sufficient. Therefore, there is a disadvantage that because of long-term use, the light reflectivity of the insulating resin layer is reduced due to the heat and light from the LED and as a result, extraction efficiency of the light in the light emitting diode device is reduced.

It is an object of the present invention to provide a reflecting material having an excellent heat resistance and light resistance, and a light emitting diode device including a reflector formed of the reflecting material and having an excellent extraction efficiency of light.

A reflecting material of the present invention contains a silicone resin composition prepared from a polysiloxane containing silanol groups at both ends, an ethylenic silicon compound, a silicon compound containing an epoxy group, an organohydrogenpolysiloxane, a condensation catalyst, and an addition catalyst; and a light reflecting component.

In the reflecting material of the present invention, it is preferable that the light reflecting component is a white pigment.

In the reflecting material of the present invention, it is preferable that the light reflecting component is a titanium oxide.

In the reflecting material of the present invention, it is preferable that the light reflecting component is a titanium oxide having a rutile type crystal structure.

It is preferable that the reflecting material of the present invention further contains an inorganic filler.

In the reflecting material of the present invention, it is preferable that the silicone resin composition is in a semi-cured state.

It is preferable that the reflecting material of the present invention is formed into a sheet state.

A light emitting diode device of the present invention includes a board, a light emitting diode element provided on the board, and a reflector provided on the board so as to surround the light emitting diode element and formed of the above-described reflecting material.

In the light emitting diode device, it is preferable that the reflector is provided so as to be in close contact with a side surface of the light emitting diode element.

The reflecting material of the present invention contains the above-described silicone resin composition and light reflecting component, so that the reflecting material has an excellent light reflectivity, heat resistance, and light resistance.

Also, the reflecting material contains the above-described silicone resin composition, so that the reflecting material is prepared in a semi-cured state and can be formed in a sheet state. Therefore, the handling ability thereof is excellent.

As a result, in the light emitting diode device of the present invention provided with the reflector formed of such a reflecting material, the production efficiency is improved and the extraction efficiency of the light is excellent.

BRIEF DESCRIPTION OF THE DRAWINGS

(a) illustrating a step of preparing the reflecting sheet, (b) illustrating a step of disposing the reflecting sheet in opposed relation to the upper side of a board, and (c) illustrating a step of laminating the reflecting sheet on the board.

(d) illustrating a step of peeling off a release substrate from a reflecting precursor and (e) illustrating a step of forming a phosphor layer.

(a) illustrating a step of preparing the reflecting sheet, (b) illustrating a step of forming a through hole, (c) illustrating a step of disposing the reflecting sheet in opposed relation to the upper side of the board, and (d) illustrating a step of laminating the reflecting sheet on the board.

(e) illustrating a step of peeling off the release substrate from a reflector and (f) illustrating a step of performing a dicing process.

DETAILED DESCRIPTION OF THE INVENTION

A reflecting material of the present invention contains a silicone resin composition and a light reflecting component.

The silicone resin composition is a condensation/addition reaction curable type silicone resin composition which can undergo a condensation reaction and an addition reaction (to be specific, a hydrosilylation reaction). To be more specific, the silicone resin composition undergoes the condensation reaction by heating to be brought into a semi-cured (B-stage) state and subsequently, by further heating, undergoes the addition reaction to be brought into a cured (completely cured) state.

In the present invention, the silicone resin composition contains a polysiloxane containing silanol groups at both ends, an ethylenic silicon compound, a silicon compound containing an epoxy group, an organohydrogensiloxane, a condensation catalyst, and an addition catalyst.

The polysiloxane containing silanol groups at both ends, the ethylenic silicon compound, and the silicon compound containing an epoxy group are condensation materials (materials subjected to the condensation reaction). The ethylenic silicon compound and the organohydrogensiloxane are addition materials (materials subjected to the addition reaction).

The polysiloxane containing silanol groups at both ends is an organosiloxane which contains silanol groups (SiOH groups) at both ends of a molecule and to be specific, is represented by formula (1) below.

Formula (1)

(1)

(where, in formula (1), $R^1$ represents a monovalent hydrocarbon group selected from a saturated hydrocarbon group and an aromatic hydrocarbon group. "n" represents an integer of 1 or more.)

In the above-described formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described formula (1), in the monovalent hydrocarbon group represented by $R^1$, an example of the aromatic hydrocarbon group includes an aryl group having 6 to 10 carbon atoms (such as a phenyl group and a naphthyl group).

In the above-described formula (1), $R^1$ may be the same or different from each other. Preferably, $R^1$ is the same.

As the monovalent hydrocarbon group, preferably, an alkyl group having 1 to 6 carbon atoms and an aryl group having 6 to 10 carbon atoms are used, or more preferably, in view of transparency, heat resistance, and light resistance, a methyl group is used.

In the above-described formula (1), "n" is preferably, in view of stability and/or handling ability, an integer of 1 to 10000, or more preferably an integer of 1 to 1000.

"n" in the above-described formula (1) is calculated as an average value.

To be specific, examples of the polysiloxane containing silanol groups at both ends include polydimethylsiloxane containing silanol groups at both ends, polymethylphenylsiloxane containing silanol groups at both ends, and polydiphenylsiloxane containing silanol groups at both ends.

The polysiloxanes containing silanol groups at both ends can be used alone or in combination.

Of the polysiloxanes containing silanol groups at both ends, preferably polydimethylsiloxane containing silanol groups at both ends is used.

A commercially available product can be used as the polysiloxane containing silanol groups at both ends. A polysiloxane containing silanol groups at both ends synthesized in accordance with a known method can also be used.

The number average molecular weight of the polysiloxane containing silanol groups at both ends is, for example, in view of stability and/or handling ability, 100 to 1000000, or preferably 200 to 100000. The number average molecular weight is calculated by conversion based on standard polystyrene with a gel permeation chromatography. The number average molecular weight of a material, other than the polysiloxane containing silanol groups at both ends, to be described later, is also calculated in the same manner as the description above.

The silanol group content in the polysiloxane containing silanol groups at both ends is, for example, 0.002 to 25 mmol/g, or preferably 0.02 to 25 mmol/g. The silanol group content is calculated from the integral ratio of the peaks of the silanol group and the methyl group with a $^1$H-NMR.

The mixing ratio of the polysiloxane containing silanol groups at both ends is, for example, 1 to 99.99 parts by mass, preferably 50 to 99.9 parts by mass, or more preferably 80 to 99.5 parts by mass with respect to 100 parts by mass of the condensation material.

The ethylenic silicon compound is a silane compound having both an ethylenically unsaturated hydrocarbon group and a leaving group in a silanol condensation reaction and to be specific, is represented by formula (2) below.

Formula (2):

(2)

(where, in formula (2), $R^2$ represents a monovalent ethylenically unsaturated hydrocarbon group. $X^1$ represents a halogen atom, an alkoxy group, a phenoxy group or an acetoxy group. $X^1$ may be the same or different from each other.)

In the above-described formula (2), examples of the ethylenically unsaturated hydrocarbon group represented by $R^2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with the hydrosilyl group in the organohydrogensiloxane, preferably, an alkenyl group is used, more preferably, an alkenyl group having 2 to 5 carbon atoms is used, or particularly preferably, a vinyl group is used.

$X^1$ in the above-described formula (2) is a leaving group in the silanol condensation reaction. $SiX^1$ group in the above-described formula (2) is a reactive functional group in the silanol condensation reaction.

In the above-described formula (2), examples of the halogen atom represented by $X^1$ include bromine, chlorine, fluorine, and iodine.

In the above-described formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described formula (2), $X^1$ may be the same or different from each other. Preferably, $X^1$ is the same.

Of the $X^1$s in the above-described formula (2), preferably, an alkoxy group is used, or more preferably, a methoxy group is used.

Examples of the ethylenic silicon compound include trialkoxysilane containing an ethylenically unsaturated hydrocarbon group, trihalogenated silane containing an ethylenically unsaturated hydrocarbon group, triphenoxysilane containing an ethylenically unsaturated hydrocarbon group, and triacetoxysilane containing an ethylenically unsaturated hydrocarbon group.

The ethylenic silicon compounds can be used alone or in combination.

Of the ethylenic silicon compounds, preferably trialkoxysilane containing an ethylenically unsaturated hydrocarbon group is used.

To be specific, examples of the trialkoxysilane containing an ethylenically unsaturated hydrocarbon group include vinyltrialkoxysilane such as vinyltrimethoxysilane, vinyltriethoxysilane, and vinyltripropoxysilane; allyltrialkoxysilane such as allyltrimethoxysilane; propenyltrialkoxysilane such as propenyltrimethoxysilane; butenyltrialkoxysilane such as butenyltrimethoxysilane; and cyclohexenyltrialkoxysilane such as cyclohexenyltrimethoxysilane.

Of the trialkoxysilanes containing an ethylenically unsaturated hydrocarbon group, preferably, vinyltrialkoxysilane is used, or more preferably, vinyltrimethoxysilane is used.

The mixing ratio of the ethylenic silicon compound is, for example, 0.01 to 90 parts by mass, preferably 0.01 to 50 parts by mass, or more preferably 0.01 to 10 parts by mass with respect to 100 parts by mass of the condensation material.

A commercially available product can be used as the ethylenic silicon compound. An ethylenic silicon compound synthesized in accordance with a known method can also be used.

The silicon compound containing an epoxy group is a silane compound having both an epoxy group and a leaving group in a silanol condensation reaction and to be specific, is represented by formula (3) below.

Formula (3):

$$R^3\text{—Si}(X^2)_3 \quad (3)$$

(where, in formula (3), $R^3$ represents a group having an epoxy structure. $X^2$ represents a halogen atom, an alkoxy group, a phenoxy group or an acetoxy group. $X^2$ may be the same or different from each other.)

In the above-described formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably a glycidyl ether group is used. To be specific, the glycidyl ether group is a glycidoxyalkyl group represented by formula (4) below.

Formula (4)

(where, in formula (4), $R^4$ represents a divalent hydrocarbon group selected from a saturated hydrocarbon group and an aromatic hydrocarbon group.)

In the above-described formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably a glycidoxypropyl group is used.

$X^2$ in the above-described formula (3) is a leaving group in the silanol condensation reaction. $SiX^2$ group in the above-described formula (3) is a reactive functional group in the silanol condensation reaction.

In the above-described formula (3), examples of the halogen atom represented by $X^2$ include the same as the halogen atom represented by $X^1$ in the above-described formula (2).

In the above-described formula (3), examples of the alkoxy group represented by $X^2$ include the same as the alkoxy group represented by $X^1$ in the above-described formula (2).

In the above-described formula (3), $X^2$ may be the same or different from each other. Preferably, $X^2$ is the same.

As $X^2$ in the above-described formula (3), preferably, an alkoxy group is used, or more preferably, a methoxy group is used.

Examples of the silicon compound containing an epoxy group include trialkoxysilane containing an epoxy group, trihalogenated silane containing an epoxy group, triphenoxysilane containing an epoxy group, and triacetoxysilane containing an epoxy group.

The silicon compounds containing an epoxy group can be used alone or in combination.

Of the ethylenic silicon compounds, preferably trialkoxysilane containing an epoxy group is used.

To be specific, examples of the trialkoxysilane containing an epoxy group include glycidoxyalkyltrimethoxysilane such as glycidoxymethyltrimethoxysilane, (2-glycidoxyethyl)trimethoxysilane, and (3-glycidoxypropyl)trimethoxysilane; glycidoxyalkyltriethoxysilane such as (3-glycidoxypropyl)triethoxysilane; glycidoxyalkyltripropoxysilane such as (3-glycidoxypropyl)tripropoxysilane; and glycidoxyalkyltripropoxysilane such as (3-glycidoxypropyl)triisopropoxysilane.

Of the trialkoxysilanes containing an epoxy group, preferably, glycidoxymethyltrialkoxysilane is used, or more preferably, (3-glycidoxypropyl)trimethoxysilane is used.

The mixing ratio of the silicon compound containing an epoxy group is, for example, 0.01 to 90 parts by mass, preferably 0.01 to 50 parts by mass, or more preferably 0.01 to 1 parts by mass with respect to 100 parts by mass of the condensation material.

A commercially available product can be used as the silicon compound containing an epoxy group. A silicon compound containing an epoxy group synthesized in accordance with a known method can also be used.

The molar ratio ($SiOH/(SiX^1+SiX^2)$) of the silanol group (the SiOH group) in the polysiloxane containing silanol groups at both ends to the reactive functional group (the $SiX^1$ group and the $SiX^2$ group) in the ethylenic silicon compound and the silicon compound containing an epoxy group is, for example, 20/1 to 0.2/1, preferably 10/1 to 0.5/1, or more preferably substantially 1/1.

When the molar ratio exceeds the above-described range, there may be a case where a product in a semi-cured state (a semi-cured product) having an appropriate toughness is not obtained when the silicone resin composition is brought into a semi-cured state. On the other hand, when the molar ratio is below the above-described range, the mixing ratio of the ethylenic silicon compound and the silicon compound containing an epoxy group is excessively large, so that the heat resistance of the obtained reflector (described later) may be reduced.

When the molar ratio is within the above-described range (preferably, substantially 1/1), the silanol group (the SiOH group) in the polysiloxane containing silanol groups at both ends, and the reactive functional group (the $SiX^1$ group) in the ethylenic silicon compound and the reactive functional group (the $SiX^2$ group) in the silicon compound containing an epoxy group can be subjected to a condensation reaction neither too much nor too little.

The molar ratio of the ethylenic silicon compound to the silicon compound containing an epoxy group is, for example, 10/90 to 99/1, preferably 50/50 to 97/3, or more preferably 80/20 to 95/5.

When the molar ratio is within the above-described range, there is an advantage that the adhesiveness of the cured product can be improved, while the strength thereof is ensured.

The organohydrogensiloxane is an organosiloxane having, in one molecule, at least two hydrosilyl groups (the SiH groups) without containing an ethylenically unsaturated hydrocarbon group.

To be specific, an example of the organohydrogensiloxane includes an organopolysiloxane such as an organopolysiloxane containing a hydrogen atom in its side chain and an organopolysiloxane containing hydrogen atoms at both ends.

The organopolysiloxane containing a hydrogen atom in its side chain is an organohydrogenpolysiloxane having a hydrogen atom as a side chain that branches off from the main chain and is represented by formula (5).

(5)

(where A to D represent a constituent unit, A and D represent an end unit, and B and C represent a repeating unit. $R^5$ represents a monovalent hydrocarbon group selected from a saturated hydrocarbon group and an aromatic hydrocarbon group. "b" represents an integer of 0 or 1 or more and "c" represents an integer of 2 or more.)

A to D constitute an organopolysiloxane containing a hydrogen atom in its side chain.

The monovalent hydrocarbon group represented by $R^5$ in formula (5) may be the same or different from each other. Preferably, the monovalent hydrocarbon group is the same.

In the monovalent hydrocarbon group represented by $R^5$, examples of the saturated hydrocarbon group and the aromatic hydrocarbon group include the same as the saturated hydrocarbon group and the aromatic hydrocarbon group illustrated by $R^1$ in the above-described formula (1). As the monovalent hydrocarbon group, preferably, methyl and phenyl are used, or more preferably, methyl is used.

"b" is preferably, in view of reactivity and stability, an integer of 1 to 10000, more preferably an integer of 2 to 5000, or particularly preferably an integer of 5 to 100.

"c" is 2 or more, or is preferably, in view of reactivity and stability, an integer of 1 to 10000, more preferably an integer of 2 to 1000, or particularly preferably an integer of 5 to 100.

Examples of the organopolysiloxane containing a hydrogen atom in its side chain include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane.

The number average molecular weight of the organopolysiloxane containing a hydrogen atom in its side chain is, for example, 100 to 1000000.

The organopolysiloxane containing hydrogen atoms at both ends is an organohydrogenpolysiloxane having hydrogen atoms at both ends of the main chain and is represented by formula (6).

(6)

(where $R^6$ represents a monovalent hydrocarbon group selected from a saturated hydrocarbon group and an aromatic hydrocarbon group. "d" represents an integer of 0 or 1 or more.)

In the monovalent hydrocarbon group represented by $R^6$, examples of the saturated hydrocarbon group and the aromatic hydrocarbon group include the same as the saturated hydrocarbon group and the aromatic hydrocarbon group illustrated by $R^1$ in the above-described formula (1). As the monovalent hydrocarbon group, preferably, methyl and phenyl are used, or more preferably, methyl is used.

"d" is preferably, in view of reactivity and stability, an integer of 0 to 10000, or more preferably an integer of 1 to 5000.

Examples of the organopolysiloxane containing a hydrogen atom in its side chain include polydimethylsiloxane containing hydrosilyl groups at both ends, polymethylphenylsiloxane containing hydrosilyl groups at both ends, and polydiphenylsiloxane containing hydrosilyl groups at both ends.

The number average molecular weight of the organopolysiloxane containing hydrogen atoms at both ends is, for example, in view of stability and/or handling ability, 100 to 1000000, or preferably 100 to 100000.

The organohydrogensiloxanes can be used alone or in combination.

Of the organohydrogensiloxanes, preferably, the organopolysiloxane containing a hydrogen atom in its side chain is used, or more preferably, dimethylpolysiloxane-co-methylhydrogenpolysiloxane is used.

The viscosity of the organohydrogensiloxane at 25° C. is, for example, 10 to 100000 mPa·s, or preferably 20 to 50000 mPa·s. The viscosity is measured using a B-type viscometer.

The hydrosilyl group content in the organohydrogensiloxane is, for example, 0.1 to 15 mmol/g, or preferably 0.5 to 10 mmol/g. The hydrosilyl group content is calculated from the integral ratio of the peaks of the hydrosilyl group and the methyl group with a $^1$H-NMR.

A commercially available product can be used as the organohydrogensiloxane. An organohydrogensiloxane synthesized in accordance with a known method can also be used.

The mixing ratio of the organohydrogensiloxane is, although depending on the molar ratio of the ethylenically unsaturated hydrocarbon group ($R^2$ in the above-described formula (2)) in the ethylenic silicon compound to the hydrosilyl group (the SiH group) in the organohydrogensiloxane, for example, 10 to 10000 parts by mass, or preferably 100 to 1000 parts by mass with respect to 100 parts by mass of the ethylenic silicon compound.

The molar ratio ($R^2$/SiH) of the ethylenically unsaturated hydrocarbon group ($R^2$ in the above-described formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can also be set to be, for example, less than 1/1 and not less than 0.05/1.

When the molar ratio exceeds 20/1, there may be a case where a semi-cured product having an appropriate toughness is not obtained when the silicone resin composition is brought into a semi-cured state. On the other hand, when the molar ratio is below 0.05/1, the mixing ratio of the organohydrogensiloxane is excessively large, so that the heat resistance and the toughness of the obtained reflector (described later) may be insufficient.

When the molar ratio is less than 1/1 and not less than 0.05/1, in allowing the silicone resin composition to be in a semi-cured state, the silicone resin composition can be quickly transferred into a semi-cured state with respect to the silicone resin composition whose molar ratio is 20/1 to 1/1.

The condensation catalyst is not particularly limited as long as it is a substance capable of improving the reaction speed of the condensation reaction of the silanol group and the reactive functional group (the $SiX^1$ group in the above-described formula (2) and the $SiX^2$ group in the above-described formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

The condensation catalysts can be used alone or in combination.

Of the condensation catalysts, in view of compatibility and thermal decomposition characteristics, preferably, a base is used, or more preferably, tetramethylammonium hydroxide is used.

The mixing ratio of the condensation catalyst is, for example, 0.1 to 50 moles, or preferably 0.25 to 5 moles with respect to 100 moles of the polysiloxane containing silanol groups at both ends.

The addition catalyst is not particularly limited as long as it is a substance (a hydrosilylation catalyst) capable of improving the reaction speed of the addition reaction, that is, the hydrosilylation reaction of the ethylenically unsaturated hydrocarbon group and the hydrosilyl group (the SiH group) and a metal catalyst is, for example, used. Examples of the metal catalyst include platinum catalysts such as platinum black, platinum chloride, chloroplatinic acid, a platinum olefin complex, a platinum carbonyl complex, and platinum acetyl acetate; palladium catalysts; and rhodium catalysts.

Of the addition catalysts, in view of compatibility and transparency, preferably, a platinum catalyst is used, or more preferably, a platinum olefin complex is used. To be specific, a platinum-1,3-divinyl-1,1,3,3-tetramethyldisiloxane complex or a platinum-divinylsiloxane complex is used.

The addition catalysts can be used alone or in combination.

Of the addition catalysts, in view of compatibility, transparency, and catalyst activity, preferably, a platinum catalyst is used, or more preferably, a platinum-carbonyl complex is used.

The mixing ratio of the addition catalyst is, as a number of parts by mass of the metal amount in the addition catalyst, with respect to 100 parts by mass of the organohydrogensiloxane, for example $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass.

As the above-described condensation catalyst and addition catalyst, a condensation catalyst and an addition catalyst in a solid state can be used as it is. Alternatively, in view of handling ability, a condensation catalyst and an addition catalyst can be used as a solution or as a dispersion liquid dissolved or dispersed in a solvent.

Examples of the solvent include water; an alcohol such as methanol and ethanol; and an aromatic hydrocarbon such as toluene.

A polysiloxane containing silanol groups at both ends, an ethylenic silicon compound, a silicon compound containing an epoxy group, an organohydrogensiloxane, a condensation catalyst, and an addition catalyst are blended to be stirred and mixed, so that the silicone resin composition is prepared.

To prepare the silicone resin composition, for example, the above-described materials (the condensation materials and the addition materials) and the catalysts can be blended simultaneously. Alternatively, each of the materials and each of the catalysts can be blended, respectively, at different timings. Furthermore, a part of the components can be added simultaneously and each of the components and the remaining components can be blended, respectively, at different timings.

Of the preparing methods of the silicone resin composition, preferably the following method is used. The condensation materials are first prepared and then the condensation catalyst is blended into the prepared condensation materials to prepare a mixture. Next, the addition material is blended into the prepared mixture and then the addition catalyst is blended thereto.

To be specific, after stirring and mixing the polysiloxane containing silanol groups at both ends, the ethylenic silicon compound, and the silicon compound containing an epoxy group (that is, the condensation materials) at the above-described ratio, the condensation catalyst is blended thereto to be stirred and mixed for, for example, 5 minutes to 24 hours, so that a mixture is prepared.

At the time of blending and stirring, the temperature can also be adjusted to, for example, 0 to 60° C. so as to improve compatibility and handling ability of the condensation materials.

By the above-described mixing, the condensation reaction of the SiOH group in the polysiloxane containing silanol groups at both ends and the SiH$^1$ group in the ethylenic silicon compound and the SiX$^2$ group in the silicon compound containing an epoxy group may be partially initiated. The degree of progress of the condensation reaction can be checked by $^1$H-NMR measurement based on the disappearance degree of the peak derived from the SiOH group.

Thereafter, the pressure in the system is reduced as required, so that a volatile component (a solvent and the like) is removed.

Next, the organohydrogensiloxane is blended into the prepared mixture of the condensation materials and the condensation catalyst to be stirred for, for example, 1 to 120 minutes.

At the time of blending and stirring, the temperature can also be adjusted to, for example, 0 to 60° C. so as to improve compatibility and handling ability of the mixture and the organohydrogensiloxane.

Thereafter, the addition catalyst is blended into the system (the above-described mixture) to be stirred for, for example, 1 to 60 minutes.

In this way, the silicone resin composition is prepared.

The silicone resin composition is, for example, in a liquid state (in an oil state). Although described later, after the preparation thereof, the silicone resin composition is prepared as a reflecting material by blending a light reflecting component and the like thereto. Thereafter, the reflecting material in a liquid state or in a semi-solid state is applied onto a release substrate 14 to be described later. Then, the reflecting material is heated, so that the condensation materials are subjected to a condensation reaction to be brought into a B-stage state (a semi-cured state). After the material in a B-stage state is laminated onto a board 2 to further be heated, the addition material is subjected to an addition reaction to be brought into a C-stage state (a completely cured state).

The content ratio of the silicone resin composition with respect to the reflecting material is, for example, 10 to 99.5 mass %, preferably, in view of coloring characteristics, light reflectivity and handling ability of the reflecting material, 30 to 98.5 mass %, or more preferably 40 to 60 mass %.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (lead carbonate) and calcium carbonate; and a clay mineral such as kaolin (kaolinite).

As the white inorganic pigment, preferably, the oxide is used, or more preferably, the titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. For example, the crystal structure thereof is a rutile type, a brookite type (pyromelane), an anatase type (octahedrite), or the like. Preferably, the crystal structure thereof is the rutile type.

A crystal system of the titanium oxide is not particularly limited. For example, the crystal system thereof is a tetragonal system, an orthorhombic system, or the like. Preferably, the crystal system thereof is the tetragonal system.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where the obtained reflector (described later) is exposed to a high temperature for a long time.

The light reflecting component is in the form of a particle. The shape thereof is not limited and examples of the shape thereof include, for example, a sphere shape, a plate shape, and a needle shape. An average value of the maximum length (in a case of the sphere shape, the average particle size) of the light reflecting component is in the range of, for example, 1 to 1000 nm, or preferably 100 to 500 nm. The average value of the maximum length is measured by using a laser diffraction scattering particle size analyzer.

The content ratio of the light reflecting component with respect to the reflecting material is, for example, 0.5 to 90 mass %, preferably, in view of coloring characteristics, light reflectivity and handling ability of the reflecting material, 1.5 to 70 mass %, more preferably 10 to 60 mass %, or particularly preferably 25 to 55 mass %.

The mixing ratio of the light reflecting component is, for example, 2 to 200 parts by mass, preferably 10 to 90 parts by mass, or more preferably 25 to 75 parts by mass with respect to 100 parts by mass of the silicone resin composition.

The silicone resin composition and the light reflecting component are blended to be uniformly mixed, so that the reflecting material is prepared.

The above-described light reflecting component is uniformly dispersed and mixed into the silicone resin composition.

The reflecting material can further contain an inorganic filler.

Examples of the inorganic filler include silica (silicon dioxide), barium sulfate, barium carbonate, barium titanate, titanium oxide, zirconium oxide, magnesium oxide, zinc oxide, iron oxide, aluminum hydroxide, calcium carbonate, layered mica, carbon black, diatomite, and glass fiber.

The inorganic fillers can be used alone or in combination.

Of the fillers, preferably silica (silicon dioxide) is used.

The inorganic filler is in the form of a particle. The shape thereof is not limited and examples of the shape thereof include, for example, a sphere shape, a plate shape, and a needle shape. An average value of the maximum length (in a case of the sphere shape, the average particle size) of the inorganic filler is in the range of, for example, 1 to 1000 nm, or preferably 100 to 500 nm. The average value of the maximum length is measured by using a laser diffraction scattering particle size analyzer.

The average particle size of the inorganic filler is in the range of, for example, 1 to 1000 gm, or preferably 10 to 100 gm. The average particle size is measured by using a laser diffraction scattering particle size analyzer.

The content ratio of the inorganic filler with respect to the reflecting material is, for example, 1 to 50 mass %, preferably, 5 to 40 mass %, or more preferably 15 to 30 mass %.

When the inorganic filler is blended into the reflecting material, the total parts by mass of the light reflecting component and the inorganic filler are, for example 50 to 300 parts by mass, or preferably 100 to 200 parts by mass with respect to 100 parts by mass of the silicone resin composition. Furthermore, the mass ratio (mass of light reflecting component/(mass of light reflecting component+mass of inorganic filler)) of the light reflecting component with respect to the inorganic filler is, for example, 0.0001 to 1, or preferably 0.01 to 1.

The above-described inorganic filler is uniformly dispersed and mixed into the silicone resin composition together with the light reflecting component.

The reflecting material prepared in this way is prepared in a liquid state or in a semi-solid state.

As described above, the reflecting material can be first semi-cured (in a B-stage state) by the condensation reaction and then be completely cured (in a C-stage state) by the addition reaction. Therefore, for example, when the reflecting material is formed in a semi-cured state and in a sheet state, a light emitting diode device (described later) can be produced with high production efficiency, while the handling ability thereof can be improved.

Next, one embodiment of the light emitting diode device of the present invention using a reflecting sheet formed of the reflecting material is described with reference to FIGS. 1 to 3.

Figure 1:
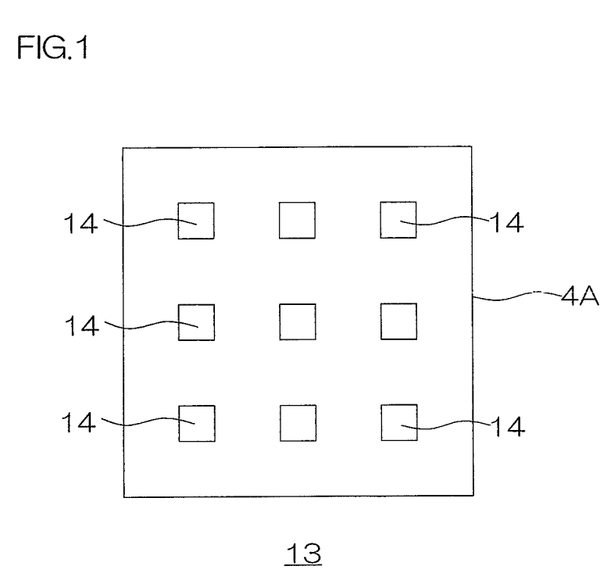
FIG. 1 shows a plan view of one embodiment of a reflecting sheet formed of a reflecting material of the present invention.

FIG. 1 shows a plan view of one embodiment of a reflecting sheet formed of a reflecting material of the present invention. FIGS. 2 and 3 show process drawings for illustrating a method for producing one embodiment of a light emitting diode device formed of the reflecting material of the present invention with the use of the reflecting sheet shown in FIG. 1.

In FIG. 3(e), a light emitting diode device 1 includes the board 2, a light emitting diode element 3 flip-chip mounted on the board 2, a reflector 4 provided so as to surround the light emitting diode element 3, and a phosphor layer 5 provided on the light emitting diode element 3.

A plurality of the light emitting diode devices 1 are provided at spaced intervals to each other in a plane direction (to be specific, a right-left direction of the paper surface and a depth direction of the paper surface in FIG. 3(e)).

That is, a plurality of the light emitting diode devices 1 include the common board 2 and on one piece of the board 2, a plurality of the light emitting diode elements 3, a reflecting resin layer 4 provided at the lateral side thereof, and the phosphor layers 5 provided on the upper surfaces of the light emitting diode elements 3. A plurality of the light emitting diode devices 1 form an assembly sheet 24.

The board 2 is formed into a generally flat plate shape. To be specific, the board 2 is formed of a laminated board in which a conductive layer, as a circuit pattern, is laminated on an insulating board. The insulating board is formed of, for example, a silicon board, a ceramic board, a polyimide resin board, or the like. Preferably, the insulating board is formed of the ceramic board, to be specific, a sapphire ($Al_2O_3$) board. The conductive layer is formed of, for example, a conductor such as gold, copper, silver, or nickel. The conductors can be used alone or in combination.

As shown in the lower portion in FIG. 2(b), the conductive layer includes a terminal 6.

The terminals 6 are formed at spaced intervals in the plane direction on the upper surface of the insulating board and are formed into a pattern corresponding to electrode portions 8 to be described later. Although not shown, the terminal 6 is electrically connected to an electric power supply portion via the conductive layer.

The light emitting diode element 3 is provided on the upper surface (one surface in a thickness direction) of the board 2 and is formed into a generally rectangular shape in plane view. A plurality of the light emitting diode elements 3 are, on the upper surface of one piece of the board 2, provided at spaced intervals to each other in the plane direction.

Each of the light emitting diode elements 3 includes a light semiconductor layer 7 and the electrode portions 8 formed on the lower surfaces thereof.

The light semiconductor layer 7 is formed into a generally rectangular shape in plane view corresponding to the outer shape of the light emitting diode element 3 and is formed into a generally rectangular shape in sectional view that is long in the plane direction.

Although not shown, for example, the light semiconductor layer 7 includes a buffer layer, an N-type semiconductor layer, a light emitting layer, and a P-type semiconductor layer that are successively laminated in the thickness direction. The light semiconductor layer 7 is formed of a known semiconductor material and is formed by a known growth method such as an epitaxial growth method. The light semiconductor layer 7 has a thickness in the range of, for example, 0.1 to 500 μm, or preferably 0.2 to 200 μm.

The electrode portion 8 is electrically connected to the light semiconductor layer 7 and is formed so as to be included in the light semiconductor layer 7 when projected in the thickness direction. The electrode portion 8 includes, for example, an anode electrode that is connected to the P-type semiconductor layer and a cathode electrode that is formed in the N-type semiconductor layer.

The electrode portion 8 is formed of a known conductive material and has a thickness in the range of, for example, 10 to 1000 nm.

The reflector 4 is provided so as to surround the light emitting diode elements 3 in plane view. The reflector 4 is, on the upper surface of the board 2, formed in a region other than the regions where the light emitting diode elements 3 are formed.

The reflector 4 is provided on the outer sides of the light emitting diode elements 3, to be specific, on both outer sides of each of the light emitting diode elements 3 in the right-left direction and in a front-rear direction.

As shown in FIG. 3(e), the reflector 4 is in close contact with each of the respective outer side surfaces of the light emitting diode elements 3, to be specific, each of the surfaces of the left surface, the right surface, the front surface (ref:

FIG. 1), and the rear surface (ref: FIG. 1) of each of the light emitting diode elements 3. In this way, the reflector 4 exposes the upper surfaces of the light emitting diode elements 3.

As referred in FIG. 1, the reflector 4 is integrally formed to be continuous. Therefore, for example, as shown in FIG. 3(e), in the reflector 4 formed between two pieces of the light emitting diode elements 3 (3A and 3B) that are disposed at spaced intervals to each other in the right-left direction, the left end portion thereof is in close contact with the right end surface of a light emitting diode element 3A disposed at the left side of the reflector 4 and the right end portion thereof is in close contact with the left end surface of a light emitting diode element 3B disposed at the right side of the reflector 4. Although not shown, in the same manner as the description above, the reflector 4 formed between two pieces of the light emitting diode elements 3 that are disposed at spaced intervals to each other in the front-rear direction is in close contact with the front surface and the rear surface of the light emitting diode elements 3, respectively. To be specific, the front end portion and the rear end portion of the reflector 4 are respectively in close contact with the front surface and the rear surface of the light emitting diode elements 3 that are respectively disposed at the front side and the rear side of the reflector 4.

In this way, the outer side surfaces of the light emitting diode elements 3 are encapsulated by the reflector 4. That is, the reflector 4 serves as an encapsulating layer that encapsulates the outer side surfaces of the light emitting diode elements 3.

The upper surface of the reflector 4 is formed to be flush with the upper surfaces, of the light emitting diode elements 3 in the plane direction.

At the lower side of the light semiconductor layer 7, lower space 12 (ref: FIG. 2(b)) each corresponding to the thickness of each of the electrode portions 8 are formed and are also filled with the reflector 4. The reflector 4 is also in close contact with the lower surfaces of the light semiconductor layers 7 exposed from the electrode portions 8 and the side surfaces of the electrode portions 8.

The reflector 4 is formed of the above-described reflecting material.

The phosphor layer 5 is formed over the entire upper surfaces of the light emitting diode elements 3. The phosphor layer 5 is formed into the same pattern as that of the outer shape of the light emitting diode element 3 when projected in the thickness direction.

The phosphor layer 5 is formed of, for example, a phosphor composition that contains a phosphor.

Preferably, the phosphor composition contains the phosphor and a resin.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include garnet type phosphor having a garnet type crystal structure such as $Y_3Al_5O_{12}$:Ce (YAG (yttrium aluminum garnet):Ce), $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce; silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; aluminate phosphor such as $CaAl_{12}O_{19}$:Mn and $SrAl_2O_4$:Eu; sulfide phosphor such as ZnS:Cu, Al, CaS:Eu, $CaGa_2S_4$:Eu, and $SrGa_2S_4$:Eu; oxynitride phosphor such as $CaSi_2O_2N_2$:Eu, $SrSi_2O_2N_2$:Eu, $BaSi_2O_2N_2$:Eu, and Ca-α-SiAlON; nitride phosphor such as $CaAlSiN_3$:Eu and $CaSi_5N_8$:Eu; and fluoride-based phosphor such as $K_2SiF_6$:Mn and $K_2TiF_6$:Mn. Preferably, garnet type phosphor is used, or more preferably, $Y_3Al_5O_{12}$:Ce (YAG) is used.

The phosphor is in the form of a particle. The shape thereof is not limited and examples of the shape thereof include, for example, a sphere shape, a plate shape, and a needle shape. An average value of the maximum length (in a case of the sphere shape, the average particle size) of the phosphor is in the range of, for example, 10 nm to 1000 μm. The average value of the maximum length is measured by using a laser diffraction scattering particle size analyzer.

The phosphors can be used alone or in combination of two or more.

The mixing ratio of the phosphor with respect to the phosphor composition is, for example, 1 to 50 mass %, or preferably 5 to 30 mass %. The mixing ratio of the phosphor is, for example, 1 to 100 parts by mass, or preferably 5 to 40 parts by mass with respect to 100 parts by mass of the resin.

The resin is a matrix in which the phosphor is dispersed, including, for example, transparent resins such as silicone resin, epoxy resin, and acrylic resin. Preferably, in view of durability, the silicone resin is used.

The silicone resin has, in its molecule, a main chain mainly composed of the siloxane bond (—Si—O—Si—) and a side chain, which is bonded to silicon atoms (Si) of the main chain, composed of an organic group such as an alkyl group (for example, a methyl group and the like) or an alkoxyl group (for example, a methoxy group).

To be specific, examples of the silicone resin include dehydration condensation type silicone resin, addition reaction type silicone resin, peroxide curable silicone resin, moisture curable silicone resin, and curable silicone resin. Preferably, the addition reaction type silicone resin is used.

The silicone resin has a kinetic viscosity at 25° C. in the range of, for example, 10 to 30 mm²/s.

The resins can be used alone or in combination of two or more.

The mixing ratio of the resin with respect to the phosphor composition is, for example, 50 to 99 mass %, or preferably 70 to 95 mass %.

The phosphor and the resin are blended at the above-described mixing ratio to be stirred and mixed, so that the phosphor composition is prepared.

Next, a method for producing the above-described light emitting diode device 1 is described with reference to FIGS. 1 to 3.

In this method, as shown in FIGS. 1 and 2(a), a reflecting sheet 13 is first prepared.

The reflecting sheet 13 is a transfer sheet for providing the reflector 4 (ref: FIG. 3(e)) so that the reflector 4 surrounds the light emitting diode elements 3. In the reflecting sheet 13, a reflecting precursor 4A forming the reflector 4 is provided. The reflecting precursor 4A is formed in a pattern corresponding to the above-described light emitting diode elements 3 such that in a transfer (ref: FIG. 2(c)) to be described later, the reflecting precursor 4A can be in close contact with the light emitting diode elements 3.

The reflecting sheet 13 includes the release substrate 14 and the reflecting precursor 4A provided on the upper surface thereof.

To obtain the reflecting sheet 13, as shown in FIG. 2(a), the release substrate 14 is first prepared.

The release substrate 14 is, for example, a release sheet (a release film) in a generally rectangular shape and the upper surface and the lower surface thereof are formed into a flat state.

The release substrate 14 is formed of a resin material and the like such as a vinyl polymer including polyolefin (to be specific, polyethylene and polypropylene) and ethylene-vinyl acetate copolymer (EVA); a polyester including polyethylene terephthalate and polycarbonate; and a fluorine resin including polytetrafluoroethylene. The release substrate 14 is also formed of a metal material such as iron, aluminum, or stainless steel.

The release substrate 14 has a thickness in the range of, for example, 10 to 1000 µm.

Next, a reflecting material is applied onto the release substrate 14 via a mask (not shown) formed into a pattern corresponding to the above-described light emitting diode elements 3, so that as shown in FIG. 2(a), a film 22 is formed in a pattern reverse to that of the light emitting diode element 3 (ref: FIG. 2(b)).

Thereafter, by heating the film 22 in the above-described pattern, the reflecting material in a semi-cured (in a B-stage) state in the above-described pattern, that is, the reflecting precursor 4A is obtained. The heating temperature is, for example, 80 to 200° C., or preferably 100 to 150° C.

As referred in FIG. 2(b) to be described later, the reflecting precursor 4A is formed in a pattern such that, when the reflecting sheet 13 is reversed upside down and the reversed reflecting sheet 13 is disposed in opposed relation to the board 2, the lower surface of the release substrate 14 exposed from the reflecting precursor 4A is overlapped with the light emitting diode elements 3 when projected in the thickness direction.

In this way, the reflecting sheet 13 including the reflecting precursor 4A and the release substrate 14 is obtained.

Separately, in this method, as shown in the lower portion in FIG. 2(b), the light emitting diode elements 3 are provided on the upper surface of the board 2.

To be specific, the electrode portions 8 are electrically connected to the terminals 6, so that the light emitting diode elements 3 are flip-chip mounted on the board 2.

Next, in this method, as shown in FIG. 2(b), the reflecting sheet 13 is disposed in opposed relation to the upper side of the board 2.

To be specific, the reflecting sheet 13 is first reversed upside down from the state shown in FIG. 2(a) and subsequently, the reflecting sheet 13 is disposed so as to be opposed to the upper surface of the board 2 exposed from the light emitting diode elements 3.

Next, the reflecting sheet 13 is laminated on the board 2. To be specific, the reflecting precursor 4A is allowed to be in contact with the upper surface of the board 2 exposed from the light emitting diode elements 3.

In this way, the reflecting precursor 4A comes in close contact with the upper surface of the board 2 exposed from the light emitting diode elements 3 and the side surfaces (the left surfaces, the right surfaces, the front surfaces, and the rear surfaces) of the light emitting diode elements 3. With this, the reflecting precursor 4A is filled in the lower space 12.

In this way, the release substrate 14 is laminated on the board 2.

Thereafter, as shown by phantom lines in FIG. 2(c), and in FIG. 3(d), the release substrate 14 is peeled off from the reflecting precursor 4A.

Thereafter, the reflecting sheet 13 is heated at, for example, 80 to 200° C., or preferably 130 to 170° C., so that the reflecting precursor 4A (a silicone resin composition contained in the reflecting material) is brought into a cured state (a C-stage state). In this way, as shown in FIG. 3(d), the reflector 4 is formed.

Next, as shown in FIG. 3(e), the phosphor layers 5 are provided on the upper surfaces of the light emitting diode elements 3.

To provide the phosphor layer 5, for example, the above-described phosphor composition is first applied onto the upper surfaces of the light emitting diode elements 3 in the above-described pattern to form a phosphor film (not shown).

Thereafter, the phosphor film is heated at, for example, 50 to 150° C. to be dried, so that the phosphor layer 5 in the above-described pattern is formed.

In this way, the light emitting diode device 1 including the board 2, the light emitting diode elements 3 flip-chip mounted on the board 2, the reflector 4 in close contact with the side surfaces of the light emitting diode elements 3, and the phosphor layers 5 provided on the upper surfaces of the light emitting diode elements 3 is obtained as the assembly sheet 24.

Thereafter, as shown by the dash-dot lines in FIG. 3(e), the reflector 4 and the board 2 formed below the reflector 4, which are located between the light emitting diode elements 3, are subjected to a cutting (dicing) process. That is, the reflector 4 and the board 2 are subjected to a dicing process along the thickness direction, so that the light emitting diode elements 3 are cut into plural pieces. That is, the light emitting diode elements 3 are individualized (singulated).

The reflecting material of the present invention contains the above-described silicone resin composition and light reflecting component, so that the reflecting material has an excellent light reflectivity, heat resistance, and light resistance.

Also, the reflecting material contains the above-described silicone resin composition, so that the reflecting material is prepared in a semi-cured state and can be formed in a sheet state. Therefore, the handling ability (formability and processability) thereof is excellent.

As a result, in the light emitting diode device 1 provided with the reflector 4 formed of such a reflecting material (the reflecting precursor 4A), the production efficiency is improved and the extraction efficiency of the light is excellent.

Figure 3:
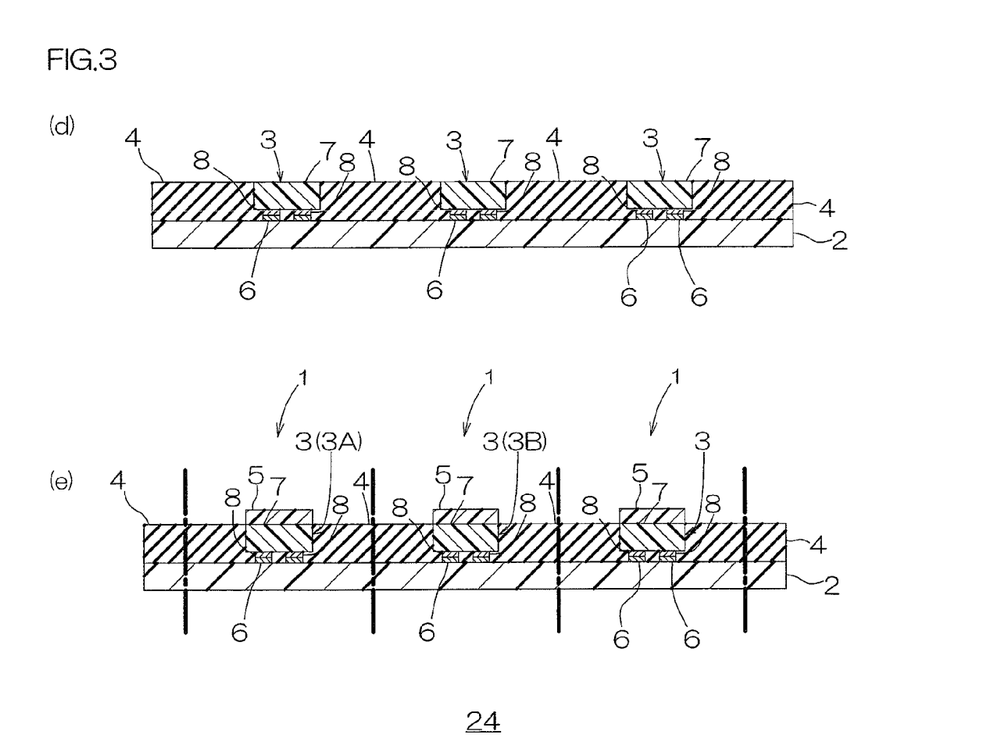
FIG. 3 shows process drawings for illustrating a method for producing one embodiment of a light emitting diode device of the present invention with the use of the reflecting sheet shown in FIG. 1, subsequent to FIG. 2.

In the embodiment in FIG. 3, the reflector 4 is in close contact with the light emitting diode elements 3. Alternatively, for example, the reflector 4 can be provided at the side of the light emitting diode elements 3 at spaced intervals to the sides thereof. In that case, side surface encapsulating layers, separately from the reflector 4, are disposed on the side surfaces of the light emitting diode elements 3. The side surface encapsulating layers are interposed between the light emitting diode element 3 and the reflector 4.

Preferably, as shown in FIG. 3(e), the reflector 4 is provided so as to be in close contact with the side surfaces of the light emitting diode elements 3.

This way, the light emitted from the light emitting diode element 3 to the side is reflected by the reflector 4 before being absorbed by the side surface encapsulating layer. As a result, the extraction efficiency of the light can further be improved.

Figure 4:
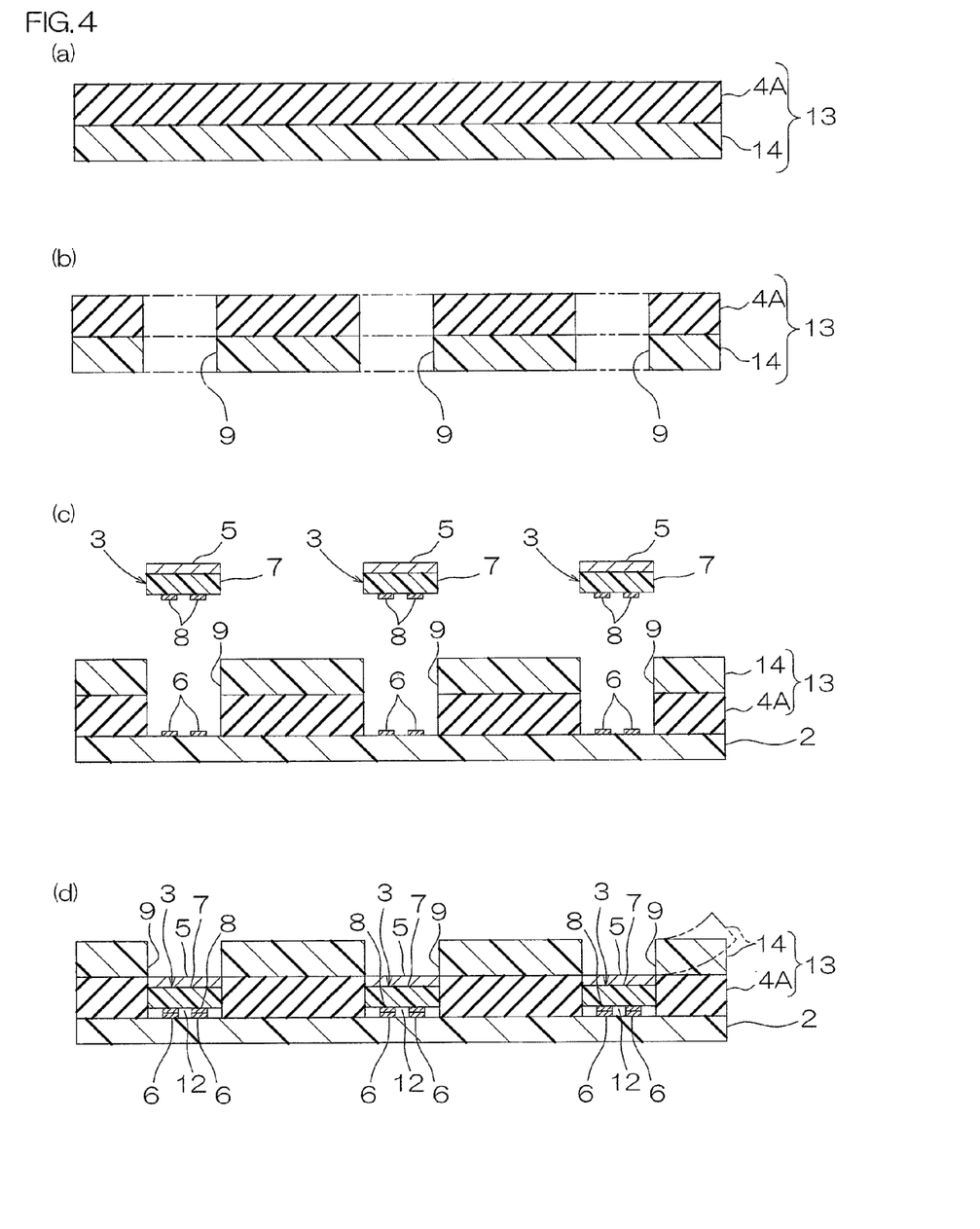
FIG. 4 shows process drawings for illustrating a method for producing another embodiment of the light emitting diode device of the present invention with the use of another embodiment of the reflecting sheet formed of the reflecting material of the present invention.
Figure 5:
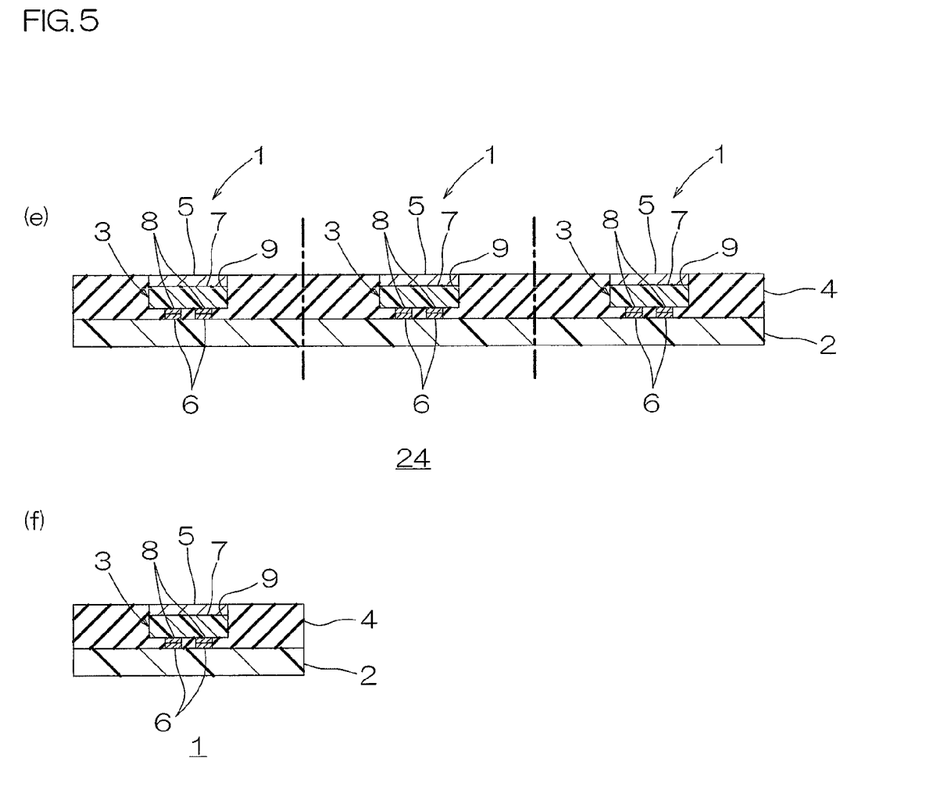
FIG. 5 shows process drawings for illustrating a method for producing another embodiment of the light emitting diode device of the present invention with the use of another embodiment of the reflecting sheet formed of the reflecting material of the present invention, subsequent to FIG. 4.

FIGS. 4 and 5 show process drawings for illustrating a method for producing another embodiment of the light emitting diode device of the present invention with the use of another embodiment of the reflecting sheet formed of the reflecting material of the present invention.

In FIGS. 4 and 5, the same reference numerals are provided for members corresponding to each of those described above, and their detailed description is omitted.

Figure 2:
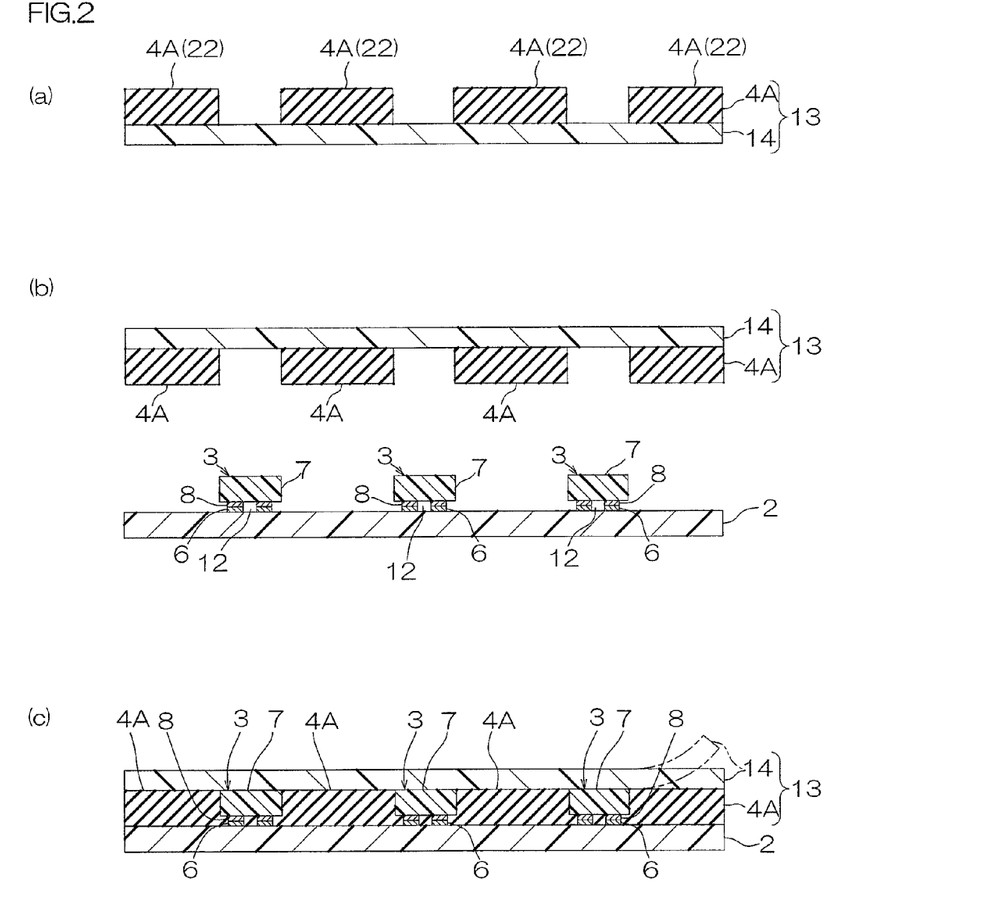
FIG. 2 shows process drawings for illustrating a method for producing one embodiment of a light emitting diode device of the present invention with the use of the reflecting sheet shown in FIG. 1.

In the embodiments in FIGS. 1 to 3, in the reflecting sheet 13, the reflecting precursor 4A is partially formed on the upper surface of the release substrate 14. Alternatively, for example, as shown in FIG. 4, the reflecting precursor 4A can be formed over the entire upper surface of the release substrate 14.

As shown in FIG. 4(a), the reflecting sheet 13 includes the release substrate 14 and the reflecting precursor 4A formed over the entire upper surface thereof.

To obtain the reflecting sheet 13, the release substrate 14 is prepared and then, the above-described reflecting material is applied onto the entire upper surface thereof to form a film.

Next, the formed film is heated to form the reflecting precursor 4A in a semi-cured (in a B-stage) state. The heating temperature is the same as the description above.

Thereafter, as shown in FIG. 4(b), through holes 9 are formed so as to extend through the release substrate 14 in the thickness direction.

That is, as referred in FIG. 4(c), the through holes 9 are formed so as to correspond to the light emitting diode elements 3. To be specific, when the reflecting sheet 13 that is reversed upside down is laminated on the board 2, the through holes 9 are formed into shapes (to be specific, generally rectangular shapes in plane view) which are substantially the same as those of the regions where the light emitting diode elements 3 are disposed and in which the inner circumference surfaces of the through holes 9 can be disposed in opposed relation to the respective side surfaces of the light emitting diode elements 3 and the phosphor layers 5 (described later).

To form the through holes 9 in the reflecting sheet 13, a known perforation method such as etching (for example, dry etching or the like), punching using a mold die, or drilling is used.

In this way, the release substrate 14 and the reflecting precursor 4A are perforated to communicate with each other and the through holes 9 having the above-described pattern are formed in the reflecting sheet 13.

Next, in this method, as shown in the lower portion in FIG. 4(c), the reflecting sheet 13 is laminated on the board 2.

That is, the reflecting sheet 13 shown in FIG. 4(b) is first reversed upside down.

Thereafter, the reversed reflecting sheet 13 is laminated on the upper surface of the board 2 so that the reflecting precursor 4A is in contact with the board 2.

Next, in this method, as shown in the upper portion in FIG. 2(c), the light emitting diode elements 3 each having the phosphor layer 5 laminated on the upper surfaces thereof are prepared.

To be specific, the phosphor layer 5 is first prepared and then, the light emitting diode elements 3 are laminated on the upper surfaces of the phosphor layers 5. Thereafter, the phosphor layers 5 and the light emitting diode elements 3 are reversed upside down.

Next, as shown in FIG. 4(d), the light emitting diode elements 3 are disposed on the upper surface of the board 2.

To be specific, the light emitting diode elements 3 are disposed in the through holes 9 in the reflecting sheet 13 to be flip-chip mounted on the board 2. The flip-chip mounting is performed by electrically connecting the electrode portions 8 to the terminals 6.

Subsequently, the reflecting sheet 13 is pressed toward the lower side.

To be specific, the reflecting sheet 13 with respect to the board 2 is pressed with, for example, a pressing machine or the like.

The above-described pressing can be performed together with heating. That is, hot pressing (to be specific, hot pressing in which the pressing is performed with a hot plate) is performed.

The heating temperature is, for example, 80 to 200° C., or preferably 130 to 170° C.

In this way, the silicone resin composition of the reflecting precursor 4A in the reflecting sheet 13 is brought into a completely cured (into a C-stage) state. In this way, the reflector 4 (ref: FIG. 5(e)) is formed.

Thereafter, as shown by the phantom lines in FIG. 4(d), and in FIG. 5(e), the release substrate 14 is peeled off from the reflector 4.

In this way, the assembly sheet 24 including a plurality of the light emitting diode devices 1 arranged in alignment is obtained.

Thereafter, as shown by the dash-dot lines in FIG. 5(e), the board 2 and the reflector 4, which are located between the light emitting diode elements 3 adjacent to each other, are subjected to a cutting (dicing) process along the thickness direction.

In this way, the light emitting diode elements 3 are cut into plural pieces. That is, the light emitting diode elements 3 are individualized (singulated).

In this way, as shown in FIG. 5(g), the light emitting diode devices 1 including the individualized light emitting diode elements 3 are obtained.

The embodiments in FIGS. 4 and 5 can achieve the same function and effect as achieved by the embodiments in FIGS. 1 to 3.

EXAMPLES

While the present invention will be described hereinafter in further detail with reference to Examples and Comparative Example, the present invention is not limited to these Examples and Comparative Example.

Example 1

100.0 g (8.70 mmol) of a polydimethylsiloxane containing silanol groups at both ends (polysiloxane containing silanol groups at both ends) (in formula (1), all of the $R^1$s are methyl groups, the average of "n" is 115, a number average molecular weight of 11500), 0.77 g (5.20 mmol) of a vinyltrimethoxysilane (ethylenic silicon compound) (in formula (2), $R^2$ is vinyl group, all of the $X^1$s are methoxy groups), 0.14 g (0.59 mmol) of (3-glycidoxypropyl)trimethoxysilane (silicon compound containing an epoxy group) (in formula (3), $R^3$ is 3-glycidoxypropyl group, all of the $X^2$s are methoxy groups), and 47.5 μL of a methanol solution with a concentration of 10 mass % tetramethylammonium hydroxide (condensation catalyst) (an amount of tetramethylammonium hydroxide: 0.04 mmol) were blended to be stirred at room temperature (25° C.) for 1 hour, so that a mixture was obtained.

The ratio of the total number (=the hydrosilyl group/the methoxy group) of the methoxy group in vinyltrimethoxysilane and the methoxy group in (3-glycidoxypropyl)trimethoxysilane with respect to the silanol group in polysiloxane containing silanol groups at both ends was 1/1 in molar ratio.

Thereafter, 2.19 g of an organopolysiloxane containing a hydrogen atom in its side chain (organohydrogensiloxane) (in formula (5), all of the $R^5$s are methyl groups, "b"=10, "c"=10, a number average molecular weight of 2000, the viscosity of 20 mPa·s (25° C.)) and 6.3 μL of a platinum-1,3-divinyl-1,1,3,3-tetramethyldisiloxane complex (addition catalyst) were blended into the obtained mixture to be mixed.

The ratio (the vinyl group/the hydrosilyl group) of the vinyl group in vinyltrimethoxysilane with respect to the hydrosilyl group in organohydrogensiloxane containing a hydrogen atom in its side chain was 1/3.0 in molar ratio.

In this way, a silicone resin composition was obtained.

Thereafter, the silicone resin composition, titanium oxide (light reflecting component, a rutile type crystal structure, an average particle size of 0.2 μm), and silica (inorganic filler, fused silica in a sphere shape, an average particle size of 23 μm) were blended in accordance with the mixing formulation of Table 1, so that a reflecting material was obtained.

TABLE 1

|  | Example 1 | Example 2 | Example 3 |
|---|---|---|---|
| Silicone Resin Composition | 50 | 29 | 50 |
| Titanium Oxide | 28 | 24 | 50 |
| Silica | 22 | 47 | 0 |

(unit: mass %)

The obtained reflecting material was applied onto the top surface of a release substrate and was heated at 115° C. to be brought into a semi-cured (into a B-stage) state. In this way, a reflecting sheet in which the reflecting material was provided on the release substrate having a thickness of 500 μm was obtained.

Thereafter, the reflecting sheet was subjected to a trimming process to have a square of about 10 cm and was heated at 150° C. for 5 hours to cure the reflecting material, so that a test piece was fabricated.

Examples 2 and 3

Reflecting materials were obtained in the same manner as in Example 1, except that the mixing ratio of the silicone resin composition, the titanium oxide, and the silica was changed in accordance with Table 1, and thereafter, the respective test pieces were obtained.

Comparative Example 1

Each of the components shown in the following was blended at the mixing ratio shown in Table 2, and was fused and mixed in a beaker to be matured. Thereafter, the mixture was cooled down to room temperature to be pulverized, so that an epoxy resin composition in a powder state was prepared.

1,3,5-trisglycidylisocyanurate acid (epoxy resin, an epoxy equivalent of 100 g/Eq)
methylhexahydroxyphthalic anhydride (acid anhydride, an acid equivalent of 168 g/Eq)
titanium oxide (a rutile type, an average particle size of 0.2 μm)
silica (inorganic filler, an average particle size of 23 μm)
9,10-dihydro-9-oxa-10-phosphaphenanthrene-10-oxide (antioxidant)
tetra-n-butylphosphonium-o,o-diethylphosphorodithioate (accelerator)

TABLE 2

|  | Comparative Example 1 |
|---|---|
| Epoxy Resin | 18.8 |
| Acid Anhydride | 29.7 |
| Titanium Oxide | 23.2 |
| Inorganic Filler | 26.8 |
| Antioxidant | 1.1 |
| Accelerator | 0.4 |

(unit: mass %)

The prepared epoxy resin composition was molded by heating at 150° C. for 4 minutes and then was cured by heating at 150° C. for 5 hours, so that a test piece having a thickness of 1 mm was fabricated.

(Evaluation)

1. Heat Resistance (Reduction Rate of Light Transmittance)

The light reflectivity with respect to the light at a wavelength of 380 to 800 nm of the test pieces in Examples 1 to 3 and Comparative Example 1 was measured at room temperature (25° C.) by a spectrophotometer (U-670, manufactured by JASCO Corporation) to confirm whether the light reflectivity was maintained 80% or more over the entire regions of the test pieces in a plane direction.

Figure 6:
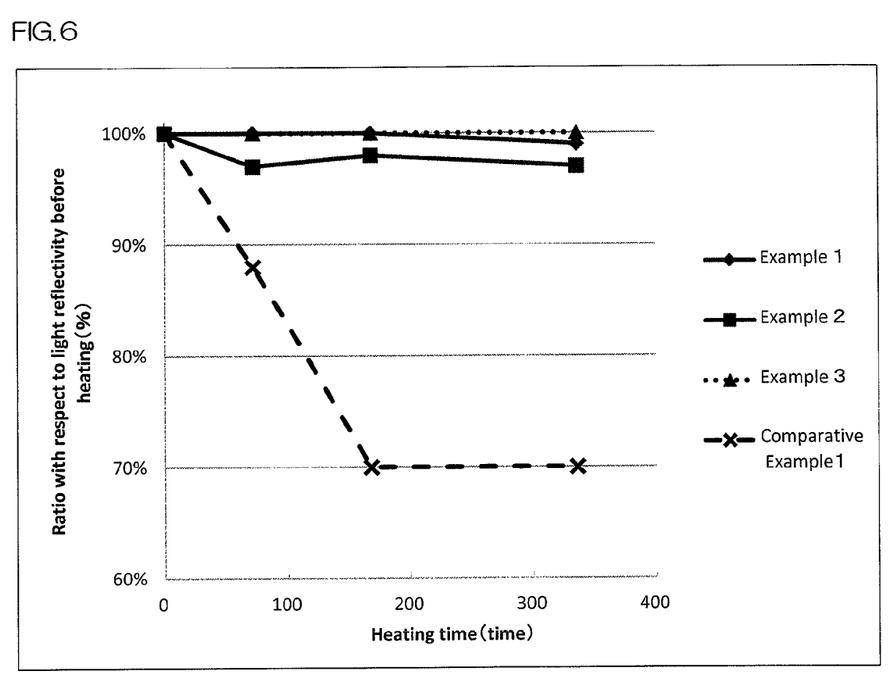
FIG. 6 shows a graph for illustrating a relationship between a heating time and a ratio with respect to light reflectivity before heating in the heat resistance evaluation of Examples.

Next, the test pieces were heated at 180° C. to measure the light reflectivity at a wavelength of 450 nm after the elapse of a predetermined period of time. And, the ratio (percentage) with respect to the light reflectivity of the test pieces at a wavelength of 450 nm measured at room temperature (that is, the light reflectivity before heating) was calculated to evaluate the heat resistance. The results are shown in Table 3 and a graph in FIG. 6.

TABLE 3

|  | 0 hour | 72 hours | 168 hours | 336 hours |
|---|---|---|---|---|
| Example 1 | 100% | 100% | 100% | 99% |
| Example 2 | 100% | 97% | 98% | 97% |
| Example 3 | 100% | 100% | 100% | 100% |
| Comparative Example 1 | 100% | 88% | 70% | 70% |

(the percentage with respect to the light reflectivity before heating)

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A reflecting material comprising:
a silicone resin composition prepared from a polysiloxane containing silanol groups at both ends, an ethylenic silicon compound, a silicon compound containing an epoxy group, an organohydrogenpolysiloxane, a condensation catalyst, and an addition catalyst; and
a light reflecting component.

2. The reflecting material according to claim 1, wherein the light reflecting component is a white pigment.

3. The reflecting material according to claim 1, wherein the light reflecting component is a titanium oxide.

4. The reflecting material according to claim 1, wherein the light reflecting component is a titanium oxide having a rutile type crystal structure.

5. The reflecting material according to claim 1, wherein the reflecting material further comprises an inorganic filler.

6. The reflecting material according to claim 1, wherein the silicone resin composition is in a semi-cured state.

7. The reflecting material according to claim 6, wherein the reflecting material is formed into a sheet state.

8. A light emitting diode device comprising:
a board,
a light emitting diode element provided on the board, and
a reflector provided on the board so as to surround the light emitting diode element and formed of a reflecting material, wherein
the reflecting material comprising:

a silicone resin composition prepared from a polysiloxane containing silanol groups at both ends, an ethylenic silicon compound, a silicon compound containing an epoxy group, an organohydrogenpolysiloxane, a condensation catalyst, and an addition catalyst; and a light reflecting component.

9. The light emitting diode device according to claim 8, wherein the reflector is provided so as to be in close contact with a side surface of the light emitting diode element.

* * * * *